United States Patent [19]
Oh et al.

[11] Patent Number: 5,659,549
[45] Date of Patent: Aug. 19, 1997

[54] MEMORY TEST SYSTEM HAVING A PATTERN GENERATOR FOR A MULTI-BIT TEST

[75] Inventors: Sang-Chul Oh; Sung-Bum Cho, both of Kyungki-do, Rep. of Korea

[73] Assignee: Samsung Electronics Co., Ltd., Suwon, Rep. of Korea

[21] Appl. No.: 702,929

[22] Filed: Aug. 26, 1996

[30] Foreign Application Priority Data

Aug. 31, 1995 [KR] Rep. of Korea .................... 28409

[51] Int. Cl.⁶ .................................................. G06F 11/00
[52] U.S. Cl. .................................................. 371/21.3
[58] Field of Search ........................... 371/21.3, 21.2, 371/21.6, 27; 365/201; 324/158 R

[56] References Cited

U.S. PATENT DOCUMENTS 4,835,774  5/1989  Ooshima et al. .................... 371/25

*Primary Examiner*—Vincent P. Canney
*Attorney, Agent, or Firm*—Marger, Johnson, McCollom & Stolowitz, P.C.

[57] ABSTRACT

A semiconductor memory testing methods and apparatus are arranged to accommodate a multi-bit mode of testing operation in which the memory under test itself includes internal peripheral circuits for comparing the contents of memory cells for multi-bit testing, and outputting a single-bit indicative of whether or not said multiple cells have the same state. The present invention includes methods and apparatus for determining the polarity of a memory cell under test, and taking that polarity into account informing expected data to be compared to the output of the memory under test.

12 Claims, 3 Drawing Sheets

MEMORY TEST SYSTEM HAVING A PATTERN GENERATOR FOR A MULTI-BIT TEST

BACKGROUND OF THE INVENTION

1. Field of the Invention

The present invention relates to a memory test system for testing a semiconductor memory device, and more particularly to a pattern generator for use in conducting multi-bit tests of the semiconductor memory device.

The present application for a memory test system having a pattern generator for a multi-bit test, is based on and claims priority from Korean Patent Application No. 28409/1995 which is incorporated herein by reference for all purposes.

2. Description of the Related Art

In the prior art, the testing time required to verify the integrity of a semiconductor memory device continues to increase with device density. Various testing techniques and algorithms have been proposed. In the basic data in-out testing, after one bit of test data is written-in and read-out from one memory cell, written-in data and the read-out data are compared in a logic comparator to determine whether the memory cell functions correctly or not. This type of testing is purely functional rather than parametric. Multi-bit testing has also been utilized to reduce testing time. In multi-bit testing, one bit of test data is simultaneously written to a plurality of memory cells and then stored data is simultaneously read out from the same set of memory cells. Peripheral test circuitry is provided on-board the memory chip to reduce testing time and expense. The read-out data is compared with written-in data in a comparator in the peripheral circuitry on-board the chip, and the result provided externally through an output buffer. The result is applied to the logic comparator of the test system. Finally, whether the memory cell functions correctly or not is determined by the external test system logic comparator. In this multi-bit testing, however, certain test bit patterns cannot be used as they lead to erroneous results. These limitations stem from the design of the pattern generator of prior art test systems, for reasons explained below. Moreover, where peripheral test circuits are provided on-board a memory device, external test systems must properly interface with the pattern generator and the internal test circuits to achieve correct results.

FIG. 1 is a block diagram illustrating a pattern generator and the logic comparator of a memory test system in the prior art. A technique shown in FIG. 1 is disclosed in U.S. Pat. No. 4,835,774 assigned to Advantest Corporation of Japan. FIG. 1 is composed of the pattern generator 11 for generating a test pattern and supplying the test pattern to a memory under test 13. A logic comparator 15 is arranged for comparing data output from the memory under test 13 to expected data "ED" from the pattern generator 11, to determine whether the memory cell works correctly in a data in-out memory test.

The pattern generator 11 of FIG. 1 is comprised of an address generator 21 for generating an address signal and supplying the generated address signal to the memory under test 13 through an address bus 12 to select a corresponding memory cell for a writing or read operation; a data generator 22 for continuously or repeatedly generating test data; a data memory 23 for storing certain types of test data; a multiplexer 26 for selecting between the output of the data generator 22 and an output of the data memory 23, so as to provide test data to be written in the memory under test 13 though a data terminal 14; a clock generator 24 for generating a clock signal and supplying the clock signal to the memory under test 13; and a control signal generator 25 for controlling the address generator 21, the data generator 22 and the clock generator 24.

The test system described in the aforementioned '774 patent to Advantest can be modified by altering (or replacing) the data memory 23 so that it provides an indication of the polarity of a memory cell corresponding to the address signal currently provided by the address generator 21. Each memory cell has a polarity determined as true or complement by the internal architecture of the chip such as a connection relation between a data line and the memory cell of the chip. Logic data "0" or "1" is output from the data memory 23 in dependence upon the polarity of the memory cell currently addressed. For example, if a least significant bit of the current address signal is a "0", the memory cell selected by the address signal has a true polarity. Otherwise, it has a complement polarity. (Of course, just the opposite arrangement may be true in another memory device.) Data identical to that applied through the data bus 14 is stored in the memory cell having the true polarity, while data opposite to data applied through the data bus 14 is stored in the memory cell having the complement polarity. For illustration it is assumed in this specification that data "0" is output from the data memory 23 in the case that the polarity of the memory cell is true, and that data "1" is output from the data memory 23 in the case that the memory cell has complementary polarity. For present purposes, the pattern generator circuit 11 as described in the '774 patent can also be modified to change the multiplexer 26 to an XOR gate, so as to complement the data generator bit when the current cell polarity is complementary. The complemented test bit is provided to the memory under test at node (data terminal) 14.

The test operation of a test system having the pattern generator 11 as shown in FIG. 1 will be described via various examples as follows. In a first case, after data "1" is written in a true memory cell, the memory cell is tested. In this case, data "1" is output from the data generator 22 under the control of a control signal generator 25, and data "0" is output from the data memory 23 (indicating a true polarity memory cell). Accordingly, an XOR gate 26 connected with output nodes of the data generator 22 and the data memory 23 supplies data "1" to the memory under test 13 through the data terminal 14, and simultaneously supplies data "1" as expected data "ED" to the external logic comparator 15. Expected data ED supplied to the logic comparator 15 is utilized as reference data for checking whether correct data is output from the memory under test 13 or not. In other words, if data "1" is output from the memory under test 13 (node 20), the memory under test 13 passes the test, at least with respect to the cell currently addressed. And, if data "0" is output from the memory under test 13, the memory under test 13 fails.

The second case is where a test data bit "0" is generated, and the current address again corresponds to a true polarity memory cell. Accordingly, data "0" is output from the data generator 22, and data "0" is output from the data memory 23. Consequently, XOR 26 supplies data "0" to the memory under test 13 through the data terminal 14 and simultaneously supplies data "0" to the logic comparator 15. The data "0" supplied from the data terminal 14 and data output from the memory under test 13 (node 20) are compared to each other in the logic comparator 15. If the data are identical to each other, the memory under test 13 passes, as before. If the data are not identical to each other, it is thereby determined that the memory under test 13 fails.

A third case is where a test bit "1" is generated for writing in a complement polarity memory cell. Thus, data "1" is output from the data generator 22, and data "1" is output from the data memory 23. Accordingly, XOR 26 supplies data "0" to the memory under test 13 and simultaneously supplies data "0" to the logic comparator 15 through the data terminal 14. Data "0" supplied through the data terminal 14 and data output from the memory under test 13 are compared to each other. It these two data are identical to each other, the memory under test 13 passes, and if these data are not identical to each other, it fails the test.

The fourth case is where a test bit "0" is generated for writing in the complement polarity memory cell. In this case, the "0" test bit is output from the data generator 22 under control of the control signal generator 25, and data "1" is output from the data memory 23 (indicating the complement polarity of the cell currently addressed). Accordingly, XOR 26 supplies a "1" to the memory under test 13 and simultaneously supplies a "1" to the logic comparator 15 though the data terminal 14. The logic "1" output from the data terminal 14 and data output from the memory under test 13 are again compared in the logic comparator 15. As before, if the two data are identical to each other, the memory passes as to functionality of the current cell. If the two output data are not identical to each other, the memory fails.

The testing techniques summarized above are useful even in the conventional pattern generator since a normal comparative operation is achieved. However, the circuits and methods described above cannot be applied directly to multi-bit testing procedures. In multi-bit testing, complications can raise depending upon the construction of the multi-bit logic circuits provided in the peripheral circuitry on-board the memory chip. Here for illustration we assume that the internal logic circuit is constructed so as to compare a plurality of bits, e.g. a byte, of data read-out from the memory cells. A logic "1" is output from the logic circuit in the case that the plurality of bits of data are all identical, and a logic "0" is output from the logic circuit in the case where one or more bits are not identical. In this example, test accuracy cannot be achieved in the second and third cases described above, as explained next.

Taking the second case as one example, data "0" is output from the data generator 22 under the control of the control signal generator 25, and data "0" is output from the data memory 23 responsive to the address signal of the address generator 21. These two data output from the data generator 22 and the data memory 23 are compared to each other in the XOR 26 as observed previously. The XOR 26 supplies "0" to the memory under test 13 and simultaneously supplies data "0" to the logic comparator 15 as expected data ED through the data terminal 14. Expected data ED "0" and data output from the memory under test 13 at node 20 are compared to each other in the logic comparator 15. At this time, if the data are identical to each other, it is determined that the memory under test 13 passes and testing proceeds to the next data bit. If the two data are not identical to each other, it is determined that the memory under test 13 fails. However, in the case of the multi-bit test mode, since data "1" is output from the memory under test 13 in the case of passing (i.e. all the read-out bits are identical), and data "0" is output from the memory under test 13 in the case of failing, a correct data comparison cannot be achieved in logic comparator 15. This situation results in an erroneous test result, i.e. an indication that the memory chip is defective when in fact it is not. The third case is similar. Describing the third case in detail, in the multi-bit test mode, data "1" is output from the memory under test 13 in the case of passing, and data "0" is output from the memory under test 13 in the case of failing, again causing the erroneous test result in the logic comparator 15.

SUMMARY OF THE INVENTION

Accordingly, it is an object of the present invention to provide a memory test system having a pattern generator suitable for a multi-bit test operation.

It is mother object of the present invention to provide a memory test system provided with a data pattern generator having an improved fault coverage.

To achieve this and other objects, the present invention provides a semiconductor memory test system for writing and reading out data from a memory under test, and for determining whether or not one or more memory cells are functioning normally. In one exemplary embodiment, such a system includes: an address generator for generating an address signal for designating a selected memory cell of the memory under test; a data generator for generating test data; a controller for controlling the address generator and the data generator; an improved expected data (ED) generator for generating expected data responsive to a multi-bit test control signal enabled at the time of multi-bit testing; and a logic comparator for comparing data output from the memory under test to the generated expected data, so as to detect a fault of a memory cell within the memory under test.

In one preferred embodiment, the test system further includes cell polarity logic coupled to the address generator for determining a polarity of the memory cell currently being addressed. The expected data (ED) generator includes a series of three exclusive-OR ("XOR") logic gates as follows: a first XOR gate arranged for exclusively ORing data respectively output from said data generating unit and said cell polarity logic, thereby outputting said ORed data therefrom; a second XOR gate for comparing an output of said first XOR gate with the multi-bit test control signal, so as to generate data complementary to the output of the first XOR gate during multi-bit testing; and a third XOR gate for supplying reference data (ED) obtained by exclusively ORing an output of said second XOR gate and an output of said first XOR, to said comparator.

The foregoing and other objects, features and advantages of the invention will become more readily apparent from the following detailed description of a preferred embodiment which proceeds with reference to the drawings.

DETAILED DESCRIPTION OF PREFERRED EMBODIMENT

Figure 1:
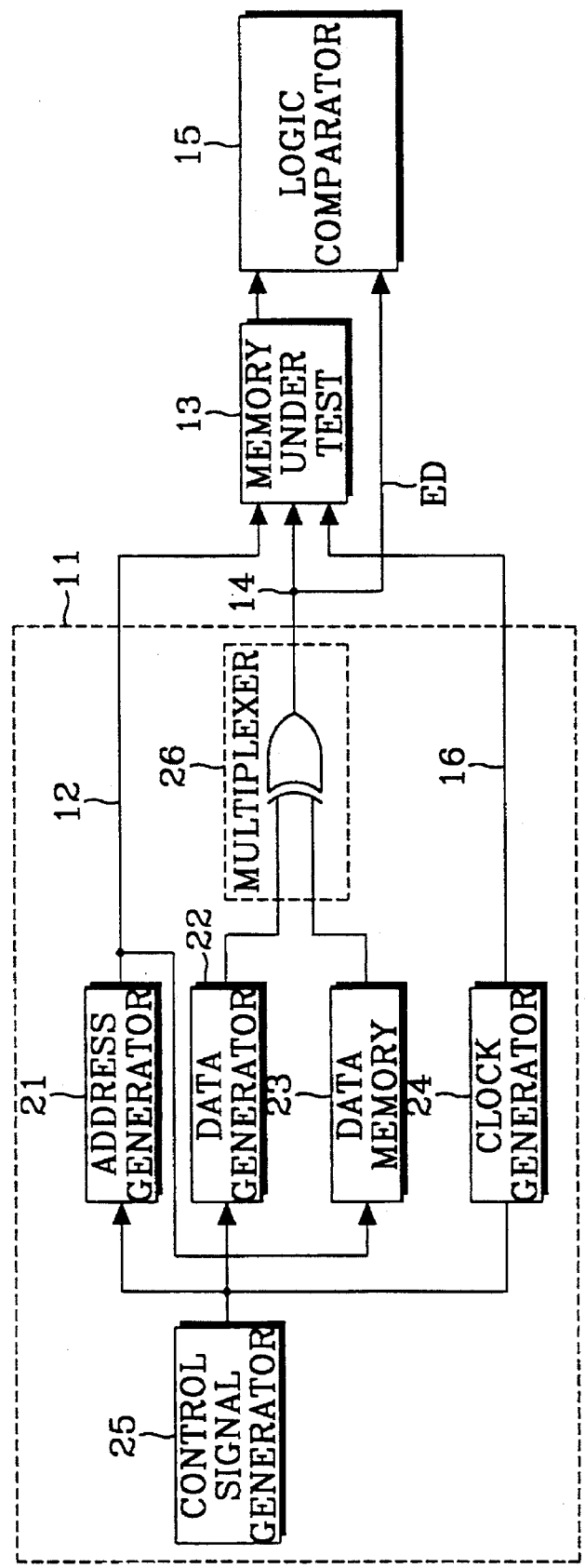
FIG. 1 is a block diagram illustrating a construction of a pattern generator of a memory test system in the prior art.

Referring to attached drawings, a preferred embodiment according to the present invention will be described in detail in the following. In the drawings, it should be noted that reference numerals of the above described elements are the same as those of the drawings according to the embodiments of the present invention.

Figure 2:
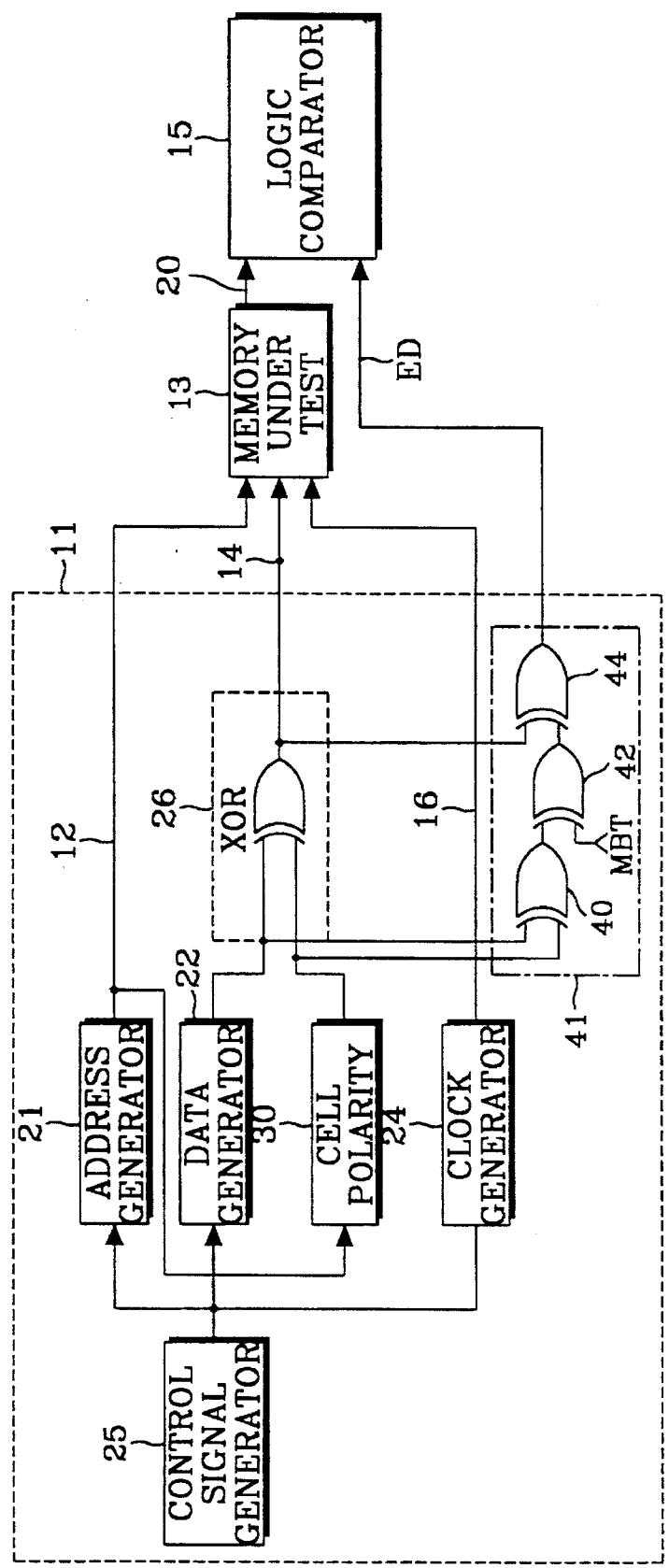
FIG. 2 is a block diagram illustrating one embodiment of a memory test system having a pattern generator according to the present invention.

FIG. 2 is a block diagram illustrating one embodiment of a memory test system having a test pattern generator according to the present invention. Referring to FIG. 2, the prior art data memory 23 has been replaced by cell polarity logic 30 as described above. The multiplexer 26 is referred to hereinafter as an XOR gate as that is the function of interest. Additionally, a logic circuit 41 is provided between the data output terminal 14 and an input node of the logic comparator 15 to provide expected data as follows.

Logic circuit 41 comprises a first exclusive-OR gate ("XOR") 40 for inputting and comparing an output of the data generator 22 and the output of the cell polarity logic 30 through two input nodes thereof, so as to provide the comparative result therefrom. A second exclusive-OR gate 42 compares a signal output from the first XOR 40 and a multi-bit test mode control signal MBT being in the logic "1" state during multi-bit testing, so as to output the comparative result therefrom. Finally a third XOR 44 is arranged for comparing signals respectively output from the output node of the XOR 26 (i.e. node 14) and the output node of the second XOR 42, to supply the output signal as expected data ED to the logic comparator 15. The test operation according to this embodiment of the present invention constructed as illustrated in FIG. 2 will be described mainly for the second and third cases in which the problem alluded to above appears in the memory test system having the pattern generator as in FIG. 1.

During multi-bit testing, the reader will recall, the second case described above is where a data "0" is written in the true memory cell. In this case, data "0" is output from the data generator 22 and data "0" is output from the cell polarity logic 30. Since a "0" is output from the data generator 22 and from the cell polarity logic, XOR 26 supplies data "0" to the memory under test 13. The memory under test 13 writes and reads data "0" output from the XOR 26 in the memory cell designated by the address signal output from the address generator 21, and then supplies data "0" to the logic comparator 15. The first XOR 40 having two input nodes respectively connected to the output nodes of the data generator 22 and the cell polarity logic 30 compares the bits presented to it. Accordingly, data "0" is output from the first XOR 40 and data "1" is output from the second XOR 42 because the multi-bit test mode signal MBT is high (data "1") at the time of the multi-bit test mode. As described above, data "1" output from the second XOR 42 is supplied to one input node of the third XOR 44. Accordingly, the third XOR 44 having the other input node connected to the output node of the XOR 26 (node 14) supplies data "1" which is obtained by exclusively ORing the output of the second XOR 42 and the output of the XOR 26, to the logic comparator 15 as expected data ED. Accordingly, data "0" output from the memory under test 13 and expected data ED "1" output from the third EXOR 44 are compared to each other in the logic comparator 15, so that data output from the memory under test 13 can be correctly checked. In other words, if data "1" is output from the memory under test 13, it is determined that the memory under test 13 passes, and if data "0" is output from the memory under test 13, it is determined that the memory under test 13 fails.

The third case is that in which a data "1" is written in the complement polarity memory cell. In that case, data "1" is output from the data generator 22 and data "1" is output from the cell polarity logic 30. Again memory under test 13 writes and reads out data "0" output from the XOR 26, from the memory cell designated by the address signal of the address generator 21, and then supplies data "0" to the logic Comparator 15. In such case, data "0" is output from the first XOR 40, and data "1" is output from the second XOR 42 by the control signal having the logic "1" at the time of the multi-bit test, that is, the multi-bit Test mode control signal MBT. Also, data "0" is output from the XOR 26 and data "1" is output from the second XOR 42, so that data "1" is output from the third XOR 44. Therefore, data output from the memory under test 13 can be checked by the logic comparator 15. If data "1" is output from the memory under test 13, the memory under test 13 passes, and if data "0" is output from the memory under test 13, the memory fails this test.

To summarize, XOR 40 determines whether or not the second or third cases are presented. If so, the output of 40 is logic "0". XOR 42 complements that "0" if the multi-bit test signal is asserted ("1"), in which case the output of 42 is a "1". That input causes XOR 44 to complement the test bit at node 14 (a "0"), so as to form a logic "1" as the ED reference data.

Accordingly, it can be seen that in the cases of testing (1) a true polarity memory cell after data "0" is written in the true memory cell, and (2) a complement polarity memory cell after data "1" is written in the complement memory cell, the polarity of expected data (ED), that is, the reference data being supplied to the logic comparator 15, is different from that of the data read out from the memory under test at node 20, so it becomes impossible to exactly detect whether the memory under test fails using the methods of the prior art. Where the internal test logic provides a logic "1" to indicate multiple test bits are all the same, the ED bit is forced to "1" for comparison in logic comparator 15 using the present invention.

Figure 3:
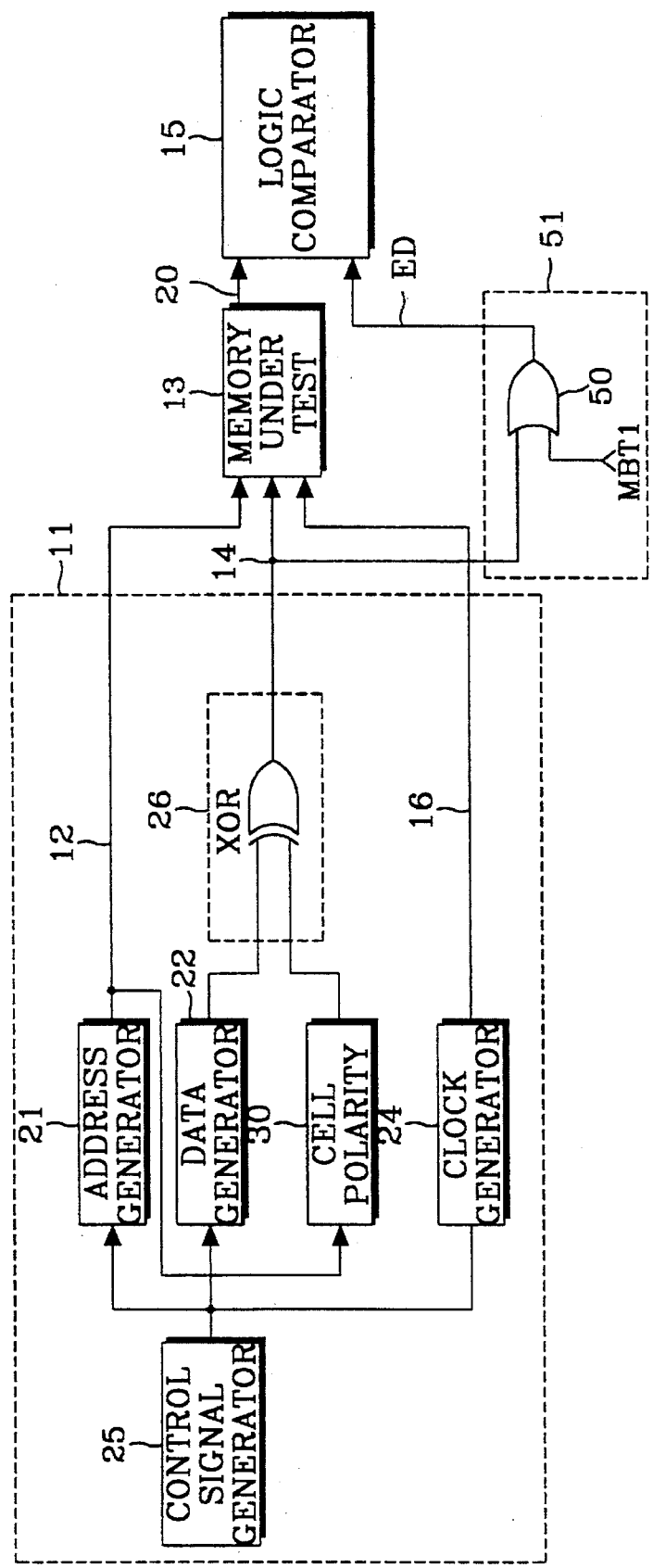
FIG. 3 is a block diagram illustrating an alternative embodiment of a memory test system having a pattern generator according to the present invention.

FIG. 3 is a block diagram illustrating another embodiment of the memory test system having an improved test pattern generator according to the present invention. In the circuit of FIG. 3, the logic circuit 41 shown in FIG. 2 is replaced by an OR gate 50. One input node of the OR gate 50 is connected to the output node 14 of the XOR gate 26 and the output of OR gate 50 provides the expected data ED input to the logic comparator 15. The other input to gate 50 is connected to receive the multi-bit test control signal MBT1. In this embodiment, the MBT1 bills set to logic "1" in the second and third cases described above during multi-bit testing only. In other words, the memory test system of FIG. 3 should be constructed so that a logic "1" is set to the control signal MBT1 supplied to the second input node of the OR gate 50 by the test program at the time of multi-bit testing, in the cases of writing data "0" in the true memory cell and writing data "1" in the complement memory cell. This embodiment illustrates that test program software can be used in lieu of some of the hardware logic.

Operation of the memory test system of FIG. 3 will be mainly described for the second and third cases described above with reference to the pattern generator of FIG. 1. During the multi-bit test mode, recall the second case above where data "0" is generated 22 for writing in a true polarity memory cell, and data "0" is output from the cell polarity logic 30. In that case, data "0" is output from the XOR 26, and then is supplied to one input node of the OR gate 50 and the memory under test 13. After the memory under test 13 writes data "0" in the memory cell designated by the address signal output from the address generator 21, data "0" is read out from the memory cell, and the data "0" is input to the logic comparitor 15. On the other hand, the control signal MBT1 is set to logic "1" dining the multi-bit test mode. That signal input to the OR gate 50 having one input node for inputting data "0" output from the XOR 26, results in a data "1" as expected data ED input to the logic comparator 15. Accordingly, data output from the memory under test 13 can be correctly checked in the logic comparator 15. In other words, if data "1" is output from the memory under test 13, it is determined that the memory under test 13 passes, and if data "0" is output from the memory under test 13, the memory under test 13 fails.

In the multi-bit test mode, the third case is the case that data "1" is generated for writing in a complement memory cell. The test data "1" is output from the data generator 22 and data "1" is output from the cell polarity logic 30 (indicating complementary cell polarity). A logic "0" is output from the XOR 26 and combined with the control signal MBT1 supplied as data "1" during multi-bit testing, so as to output data "1" from the OR gate 50. Accordingly, data output from the memory under test 13 can be correctly checked in the logic comparator 15. If a data "1" is output from the memory under test 13, indicating all test output bits the same, the memory under test 13 passes, and if data "0" is output from the memory under test 13, the memory under test 13 fails.

It can thus be appreciated that the embodiments of the present invention shown in FIGS. 2 and 3 includes pattern generators for providing expected data ED useful as comparative reference data for the logic comparator 15 dining single-bit or multi-bit modes of testing a memory device.

As described above, the memory test system having the pattern generator according to the present invention has an advantage in that selection of a tester or tester logic is not constrained by the polarity of the memory cells being exercised.

While there have been illustrated and described what are considered to be preferred embodiments of the present invention, it will be understood by those skilled in the art that various changes and modifications may be made, and equivalents may be substituted for elements thereof without departing from the true scope of the present invention.

We claim:

1. A semiconductor memory test system, comprising:
   an address generator for generating an address signal and supplying said generated address signal to a memory under test;
   a data generator for generating test data and supplying said generated test data to the memory under test;
   a clock generator for providing a clock signal to the address generator and to the memory under test;
   a controller for controlling and coordinating operation of the address generator, the data generator and the clock generator for writing the test data into and reading the test data out from the memory under test;
   a logic comparator for comparing an output of the memory under test with expected data, for determining whether the memory under test functions correctly; and
   a logic circuit coupled to receive the test data and a multi-bit test control signal asserted during multi-bit testing for providing said expected data to the logic comparator responsive to assertion of the multi-bit test control signal.

2. A semiconductor memory test system according to claim 1 wherein the logic circuit includes a logic OR-gate having a first input connected to the data generator and a second input connected to receive the multi-bit test control signal and an output connected to the logic comparator, so that the logic-OR gate effectively complements the test data provided to the memory under test when the multi-bit test control signal is in a logic "1" state.

3. A semiconductor memory test system according to claim 1 further comprising cell polarity logic means coupled to the address generator for determining and indicating a polarity of a memory cell corresponding to the address signal as being either true or complementary.

4. A semiconductor memory test system according to claim 3 wherein the logic circuit includes first logic means coupled to the data generator to receive the test data and coupled to the cell polarity logic means to receive an indication of the corresponding cell polarity; second logic means coupled to the first logic means and coupled to receive the multi-bit test control signal; and third logic means coupled to the second logic means to provide the expected data whereby the expected data has a predetermined logic state when the test data and the cell polarity have selected states and the multi-bit test control signal is asserted.

5. A semiconductor memory test system according to claim 3 wherein the logic circuit includes:
   a first XOR gate coupled to the data generator to receive the test data and coupled to the cell polarity logic means to receive an indication of the corresponding cell polarity;
   a second XOR gate coupled to the first XOR gate and coupled to receive the multi-bit test control signal; and
   a third XOR gate coupled to the second XOR gate to provide the expected data to the logic comparator, whereby the expected data has a predetermined logic state when the test data and the cell polarity have selected states and the multi-bit test Control signal is asserted.

6. A semiconductor memory test system according to claim 3 further comprising test bit logic means (26) arranged for combining the test data and the indication of the corresponding memory cell polarity to form a test bit for storage in the memory under test; and wherein the cell polarity logic means provides a logic "0" when the cell polarity is true and provides a logic "1" when the corresponding cell polarity is complementary; and wherein the logic circuit includes:
   a first XOR gate coupled to the data generator and coupled to the cell polarity logic means to receive an indication of the corresponding cell polarity, so as to output a logic "0" signal when a logic "0" test bit is generated and the corresponding memory cell has true polarity, or a logic "1" test bit is generated and the corresponding memory cell has complementary polarity;
   a second XOR gate coupled to the first XOR gate and coupled to receive the multi-bit test control signal so as to output a logic "1" when the first XOR output is a logic "0" and the multi-bit test control signal is a logic "1"; and
   a third XOR gate coupled to the second XOR gate and coupled to the to provide a logic "1" as the expected data to the logic comparator, for comparison to a logic "1" output by the memory under test when all of the test bits read out from the memory cells in a multi-bit test have the same state.

7. A semiconductor memory test system according to claim 3 wherein the cell polarity logic means (30) provides a logic "0" when the corresponding cell polarity is true and provides a logic "1" when the corresponding cell polarity is complementary, and further comprising:
   test bit logic means (26) arranged for combining the test data and the indication of the corresponding memory cell polarity so as to form a complemented test bit (14) for writing into the memory under test when the corresponding cell polarity is complementary; and wherein the logic circuit includes:
   control logic means coupled to the data generator and coupled to the cell polarity logic means to receive an indication of the corresponding cell polarity, so as to output a multi-bit test control signal (MBT1) having a logic "0" signal when a logic "0" test bit is generated and the corresponding memory cell has true polarity, or a logic "1" test bit is generated and the corresponding memory cell has complementary polarity; and a logic OR-gate (50) having a first input connected to receive the complemented test bit and a second input connected to receive the multi-bit test control signal, and having an output connected to the logic comparator (15) to provide the expected data (ED) signal.

8. A method of testing a semiconductor memory device under test (MUT) having an on-board multi-bit test logic circuit that outputs a memory output bit having a predetermined logic state when all of the bits read out of a selected group of cells in the memory device have the same logic state, the method comprising the steps of:

generating a current address for accessing a selected group of cells in the MUT;

generating a test bit;

determining whether the current address corresponds to a true polarity memory cell or to a complement polarity memory cell;

if the current address corresponds to a complementary polarity memory cell, complementing the test bit to form a pattern generator output bit;

if the current address corresponds to a true polarity memory cell, providing the test bit as the pattern generator output bit;

writing the pattern generator output bit to all of the selected group of cells in the MUT;

reading the memory output bit to determine whether or not all of the bits read out of the selected group of cells in the memory device have the same logic state;

forcing the expected data bit ED to a selected state; and comparing the memory output bit to the expected data bit to determine whether the MUT has a defect among the selected group of cells.

9. A method according to claim 8 wherein said forcing the expected data bit ED to a selected state includes forcing the ED to the said predetermined logic state assumed by the MUT test bit when all of the bits read out of the selected group of cells in the memory device have the same logic state.

10. A method according to claim 8 wherein said forcing the expected data bit ED to a selected state includes forcing the ED to a complement of the predetermined logic state assumed by the MUT test bit when all of the bits read out of the selected group of cells in the memory device have the same logic state.

11. A test bit pattern generator for use in testing a semiconductor memory device comprising:

an address generator for generating an address signal for addressing a memory device under test;

a data generator for generating test data to write into the memory under test;

a clock generator for clocking said memory under test and the address generator;

a controller for controlling said address generator, said data generator and said clock generator for writing the test data into and reading the test data out from the memory under test;

expected data (ED) means for forming expected data responsive to both the test data and the address signal for comparison to the data read out of the memory under test.

12. A test bit pattern generator according to claim 11 wherein the expected data means including means for complementing the test data when the address signal corresponds to a cell location in the memory having a selected polarity.

* * * * *

UNITED STATES PATENT AND TRADEMARK OFFICE
CERTIFICATE OF CORRECTION

PATENT NO.    : 5,659,549
DATED         : August 19, 1997
INVENTOR(S)   : Oh et al.

It is certified that error appears in the above-identified patent and that said Letters Patent is hereby corrected as shown below:

Column 3,
Line 20, "though the" should read -- through the --.

Column 6,
Line 61, "dining" should read -- during --.

Column 7,
Line 22, :dining: should read -- during --.

Signed and Sealed this

First Day of October, 2002

Attest:

Attesting Officer

JAMES E. ROGAN
Director of the United States Patent and Trademark Office